(12) United States Patent
Ochi

(10) Patent No.: US 8,933,452 B2
(45) Date of Patent: Jan. 13, 2015

(54) ACTIVE MATRIX SUBSTRATE, PRODUCTION METHOD, AND DISPLAY DEVICE

(75) Inventor: Hisao Ochi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 235 days.

(21) Appl. No.: 13/512,474

(22) PCT Filed: Nov. 5, 2010

(86) PCT No.: PCT/JP2010/069701
§ 371 (c)(1),
(2), (4) Date: May 29, 2012

(87) PCT Pub. No.: WO2011/065204
PCT Pub. Date: Jun. 3, 2011

(65) Prior Publication Data
US 2012/0235149 A1    Sep. 20, 2012

(30) Foreign Application Priority Data

Nov. 30, 2009   (JP) .................................. 2009-272288

(51) Int. Cl.
| | |
|---|---|
| *H01L 29/04* | (2006.01) |
| *H01L 29/49* | (2006.01) |
| *H01L 27/12* | (2006.01) |
| *H01L 29/45* | (2006.01) |
| *G02F 1/1362* | (2006.01) |

(52) U.S. Cl.
CPC ........ *H01L 29/4908* (2013.01); *H01L 27/1214* (2013.01); *H01L 29/458* (2013.01); *G02F 1/136227* (2013.01); *G02F 2001/13629* (2013.01)
USPC .................................. 257/59; 257/57; 257/72

(58) Field of Classification Search
USPC .................... 257/52, 57, 59, 72; 438/149–167
See application file for complete search history.

(56) References Cited

U.S. PATENT DOCUMENTS

2004/0241987 A1    12/2004   Kim et al.
2007/0170434 A1*   7/2007   Inoue et al. ..................... 257/72

FOREIGN PATENT DOCUMENTS

| JP | 11-311810 A | 11/1999 |
|---|---|---|
| JP | 2000-221488 A | 8/2000 |
| JP | 2001-320039 A | 11/2001 |
| JP | 2005-510064 A | 4/2005 |
| JP | 2006-3776 A | 1/2006 |
| JP | 2008-241978 A | 10/2008 |

OTHER PUBLICATIONS

Official Communication issued in International Patent Application No. PCT/JP2010/069701, mailed on Nov. 30, 2010.

* cited by examiner

*Primary Examiner* — Samuel Gebremariam
(74) *Attorney, Agent, or Firm* — Keating & Bennett, LLP

(57) ABSTRACT

Disclosed is an active matrix substrate (5) on which pixels, each having a thin film transistor (18) and a pixel electrode (19) connected to the thin film transistor (18), are disposed in a matrix, and that includes a base material (5a) on which the pixels in a matrix are formed. In a contact hole portion (H), by anodically oxidizing a three-layered metal film (metal film) (21), an anodic oxidation film (29) is formed on the three-layered metal film (21) so as to fill a contact hole of a protective layer (27), with an end portion of the anodic oxidation film (29) being placed under an insulating layer (28). In the contact hole portion (H), the pixel electrode (19) and the three-layered metal film (21) are connected to each other via the anodic oxidation film (29).

5 Claims, 6 Drawing Sheets

ACTIVE MATRIX SUBSTRATE, PRODUCTION METHOD, AND DISPLAY DEVICE

TECHNICAL FIELD

The present invention relates to an active matrix substrate on which pixels are disposed in a matrix, a production method thereof, and a display device using the active matrix substrate.

BACKGROUND ART

Recently, for example, a liquid crystal display device has been used widely in a liquid crystal television, a monitor, a mobile phone, etc., as a flat panel display that has features such as a smaller thickness and a lighter weight as compared with a conventional Braun tube. A known liquid crystal display device of this kind uses, in a liquid crystal panel as a display panel, an active matrix substrate in which a plurality of data lines (source lines) and a plurality of scanning lines (gate lines) are arranged in a matrix, and pixels, each having a TFT (Thin Film Transistor) as a switching element and a pixel electrode connected to the thin film transistor, are arranged in a matrix in the vicinities of intersections of the data lines and the scanning lines.

In the active matrix substrate as described above, the pixel electrode and a drain electrode of the thin film transistor are connected to each other via a contact hole portion. Specifically, in the active matrix substrate, generally, a protective layer is formed on the thin film transistor, and an (interlayer) insulating layer is formed on the protective layer. Further, in the contact hole portion of the active matrix substrate, by providing a contact hole in each of the protective layer and the insulating layer, the pixel electrode and the drain electrode are brought into contact with each other, whereby these electrodes are connected to each other.

Further, in the conventional active matrix substrate, generally, the contact hole of the protective layer is formed by etching the protective layer, using the insulating layer formed with the contact hole as a mask. However, in the conventional active matrix substrate, the protective layer sometimes is undercut excessively under the insulating layer during the etching, which makes a profile of the pixel electrode worse, disconnects the pixel electrode due to an improper connection of the pixel electrode to the drain electrode, etc.

Therefore, in the conventional active matrix substrate, as described in Patent Document 1 below, for example, after forming the contact hole of the protective layer by the etching, the insulating layer in the periphery of the contact hole of the protective layer is removed by performing an ashing process to expose a borderline of the protective layer in the contact hole. Thus, in this conventional active matrix substrate, an undercut structure caused in the protective layer is removed. It also is indicated that, in the contact hole portion of this conventional active matrix substrate, by forming a sidewall around the contact hole of the insulating layer and a sidewall around the contact hole of the protective layer in, for example, a stepped configuration, the occurrence of the above problems are suppressed further.

PRIOR ART DOCUMENT

Patent Document

Patent Document 1: JP 2005-510064 A

DISCLOSURE OF INVENTION

Problem to be Solved by the Invention

However, in the conventional active matrix substrate as described above, the production process cannot be simplified.

Specifically, in the conventional active matrix substrate, after forming the contact hole of the protective layer, the insulating layer in the periphery of the contact hole of the protective layer is removed by performing the ashing process to expose the borderline of the protective layer in the contact hole. However, in this conventional active matrix substrate, in order to expose the borderline of the protective layer, it takes considerable time and labor to perform the ashing process, which prevents the production process from being simplified. Especially, in the conventional active matrix substrate, when forming the sidewall around the contact hole of the insulating layer and the sidewall around the contact hole of the protective layer in the stepped configuration, the ashing process need be performed with high precision, which prevents the production process from being simplified.

In view of the above problem, it is an object of the present invention to provide an active matrix substrate whose production process can be simplified, a production method thereof, and a display device using the active matrix substrate.

Means for Solving Problem

To achieve the above object, an active matrix substrate according to the present invention is an active matrix substrate on which pixels, each having a thin film transistor and a pixel electrode connected to the thin film transistor, are disposed in a matrix, and that includes a base material on which the pixels in a matrix are formed. On the base material, a metal film connecting a drain electrode of the thin film transistor and the pixel electrode, a protective layer formed so as to cover the metal film, and a insulating layer formed on the protective layer are disposed. In each of the protective layer and the insulating layer, a contact hole of a contact hole portion connecting the pixel electrode and the metal film is provided. In the contact hole portion, an anodic oxidation film is formed on the metal film by anodically oxidizing the metal film so as to fill the contact hole of the protective layer with an end portion of the anodic oxidation film being placed under the insulating layer. In the contact hole portion, the pixel electrode and the metal film are connected to each other via the anodic oxidation film.

In the active matrix substrate configured as above, the anodic oxidation film is formed on the metal film so as to fill the contact hole of the protective layer, with an end portion of the anodic oxidation film being placed under the insulating layer. Further, in the contact hole portion, the pixel electrode and the metal film are connected to each other via the anodic oxidation film. Thereby, unlike the above conventional example, the production process can be simplified.

Further, in the above active matrix substrate, it is preferable that an end portion of the metal film is used as the drain electrode.

In this case, since the end portion of the metal film doubles as the drain electrode, an active matrix substrate produced more simply can be configured, whereby the production process can be simplified easily.

Further, in the above active matrix substrate, it is preferable that, on the base material, an auxiliary capacitance electrode for generating auxiliary capacitance is provided on the pixel basis, and an end portion of the metal film is used as the auxiliary capacitance electrode.

In this case, since the end portion of the metal film doubles as the auxiliary capacitance electrode, an active matrix substrate produced more simply can be configured in the active matrix substrate having the auxiliary capacitance electrode, whereby the production process can be simplified easily.

Further, in the above active matrix substrate, it is preferable that the metal film contains titanium or niobium, and the anodic oxidation film includes an anodic oxidation film of titanium or niobium.

In this case, since the anodic oxidation film of titanium or niobium is used, the metal film and the pixel electrode can be electrically connected to each other reliably.

Further, a display device of the present invention uses the active matrix substrate according to any one of the above configurations.

In the display device configured as above, since the active matrix substrate whose production process can be simplified is used, a display device produced simply can be configured easily.

Further, a method for producing an active matrix substrate of the present invention is a method for producing an active matrix substrate on which pixels, each having a thin film transistor and a pixel electrode connected to the thin film transistor, are disposed in a matrix, and that includes a base material on which the pixels in a matrix are formed, including: a metal film forming process in which a metal film connecting a drain electrode of the thin film transistor and the pixel electrode is formed on the base material; a protective layer forming process in which a protective layer is formed so as to cover the metal film; an insulating layer forming process in which an insulating layer is formed on the protective layer so as to be provided with a contact hole of a contact hole portion connecting the pixel electrode and the metal film; a contact hole forming process in which a contact hole of the contact hole portion is formed in the protective layer using the insulating layer as a mask; an anodic oxidation film forming process in which an anodic oxidation film is formed on the metal film so as to fill the contact hole of the protective layer with an end portion of the anodic oxidation film being placed under the insulating layer, by anodically oxidizing the metal film that is exposed in the contact hole formed in the protective layer; and a connecting process in which the pixel electrode and the metal film are connected to each other via the anodic oxidation film in the contact hole portion.

In the method for producing an active matrix substrate configured as above, in the anodic oxidation film forming process, by anodically oxidizing the metal film that is exposed in the contact hole formed in the protective layer, the anodic oxidation film is formed on the metal film so as to fill the contact hole of the protective layer, with an end portion of the anodic oxidation film being placed under the insulating layer. Further, in the connecting process, in the contact hole portion, the pixel electrode and the metal film are connected to each other via the anodic oxidation film. Thereby, unlike the above conventional example, it is unnecessary to remove the insulating layer in the periphery of the contact hole of the protective layer to expose a borderline of the protective layer in the contact hole. Consequently, unlike the above conventional example, the production process of the active matrix substrate can be simplified.

Further, in the method for producing the active matrix substrate, it is preferable that, in the metal film forming process, an end portion of the metal film is formed as the drain electrode.

In this case, since the end portion of the metal film doubles as the drain electrode, an active matrix substrate produced more simply can be configured, whereby the production process can be simplified easily.

Further, in the method for producing the active matrix substrate, it is preferable that, in the metal film forming process, an end portion of the metal film is provided on the pixel basis, and formed as an auxiliary capacitance electrode for generating auxiliary capacitance.

In this case, since the end portion of the metal film doubles as the auxiliary capacitance electrode, an active matrix substrate produced more simply can be configured in the active matrix substrate having the auxiliary capacitance electrode, whereby the production process can be simplified easily.

Further, in the method for producing the active matrix substrate, it is preferable that the metal film contains titanium or niobium, and the anodic oxidation film includes an anodic oxidation film of titanium or niobium.

In this case, since the anodic oxidation film of titanium or niobium is used, the metal film and the pixel electrode can be electrically connected to each other reliably.

Effect of the Invention

According to the present invention, it is possible to provide an active matrix substrate whose production process can be simplified, a production method thereof, and a display device using the active matrix substrate.

BRIEF DESCRIPTION OF DRAWINGS

FIG. 5 includes views illustrating production processes of the active matrix substrate.

FIG. 6 includes views illustrating production processes of the active matrix substrate.

DESCRIPTION OF THE INVENTION

Figure 1:
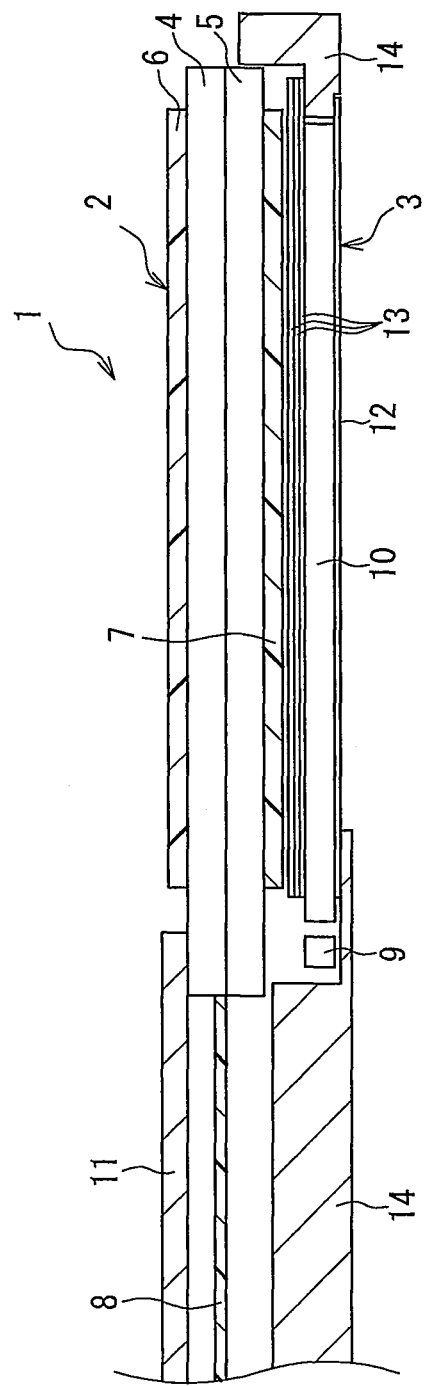
FIG. 1 is a view illustrating a liquid crystal display device according to one embodiment of the present invention.

Hereinafter, preferred embodiments of an active matrix substrate, a production method thereof, and a display device of the present invention will be described with reference to the drawings. In the following description, the present invention is applied to a transmission-type liquid crystal display device. The dimensions of constituent members in the drawings do not faithfully reflect the actual dimensions of constituent members, dimension ratio of the respective constituent members, etc.

FIG. 1 is a view illustrating a liquid crystal display device according to one embodiment of the present invention. In FIG. 1, a liquid crystal display device 1 of the present embodiment is provided with a liquid crystal panel 2 and a backlight device 3. An upper side of the liquid crystal panel 2 in FIG. 1 is defined as a viewing side (display surface side). The backlight device 3 is arranged on a non-display surface side (lower side in FIG. 1) of the liquid crystal panel 2 and generates illumination light for illuminating the liquid crystal panel 2.

The liquid crystal panel 2 includes a color filter substrate 4 and an active matrix substrate 5 of the present invention that constitute a pair of substrates, and polarizing plates 6, 7 that are provided on outer surfaces of the color filter substrate 4 and the active matrix substrate 5, respectively. A liquid crystal layer (not shown) is sandwiched between the color filter substrate 4 and the active matrix substrate 5. The color filter substrate 4 and the active matrix substrate 5 are made of a flat plate-shaped transparent glass material or a transparent synthetic resin such as an acrylic resin. The polarizing plates 6, 7 are made of a resin film such as TAC (triacetyl cellulose) or PVA (polyvinyl alcohol). The polarizing plates 6, 7 are bonded to the corresponding color filter substrate 4 or active matrix substrate 5 so as to cover at least an effective display region of a display surface of the liquid crystal panel 2.

The active matrix substrate 5 constitutes one of the pair of substrates and includes pixel electrodes, TFTs (Thin Film Transistor), etc., that are formed between the active matrix substrate 5 and the liquid crystal layer in accordance with a plurality of pixels included in the display surface of the liquid crystal panel 2 (detailed later). Meanwhile, the color filter substrate 4 constitutes the other of the pair of substrates and includes color filters, common electrodes, etc., that are formed between the color filter substrate 4 and the liquid crystal layer (not shown).

Further, the liquid crystal panel 2 is provided with a FPC (Flexible Printed Circuit) 8 that is connected to a control device (not shown) that performs drive control of the liquid crystal panel 2. The display surface is driven on a pixel basis by operating the liquid crystal layer on a pixel basis, whereby a desired image can be displayed on the display surface.

Note that the liquid crystal panel 2 can have any liquid crystal mode and any pixel structure. The liquid crystal panel 2 also can have any drive mode. In other words, any liquid crystal panel capable of displaying information can be used as the liquid crystal panel 2. Therefore, a detailed structure of the liquid crystal panel 2 is not illustrated in FIG. 1, and a description thereof is omitted.

The backlight device 3 includes a light-emitting diode 9 as a light source, and a light-guiding plate 10 that is arranged to be opposed to the light-emitting diode 9. Further, in the backlight device 3, the light-emitting diode 9 and the light-guiding plate 10 are sandwiched by a bezel 14 having an L-shape in cross section, with the liquid crystal panel 2 being located above the light-guiding plate 10. Further, a case 11 is mounted on the color filter substrate 4. Thus, the backlight device 3 is attached to the liquid crystal panel 2, and they are integrated as the transmission-type liquid crystal display device 1 in which illumination light from the backlight device 3 enters the liquid crystal panel 2.

The light-guiding plate 10 is made of a synthetic resin such as a transparent acrylic resin and receives light from the light-emitting diode 9. A reflecting sheet 12 is disposed on a surface of the light-guiding plate 10 on a side opposite to the liquid crystal panel 2 side (opposed surface side). Further, optical sheets 13 such as a lens sheet and a diffusion sheet are provided on a surface of the light-guiding plate 10 on the liquid crystal panel 2 side (light-emitting surface side). Light from the light-emitting diode 9 that is guided inside the light-guiding plate 10 in a predetermined light-guiding direction (direction from the left side to the right side in FIG. 1) is transformed into planar illumination light having a uniform brightness, and given to the liquid crystal panel 2.

In the above description, the edge-light type backlight device 3 having the light-guiding plate 10 is used. However, the present embodiment is not limited to this, and a direct type backlight device may be used. Further, a backlight device having a light source other than light-emitting diodes such as cold cathode fluorescent tubes and hot cathode fluorescent tubes also may be used.

Next, the liquid crystal panel 2 of the present embodiment will be described specifically also with reference to FIG. 2.

Figure 2:
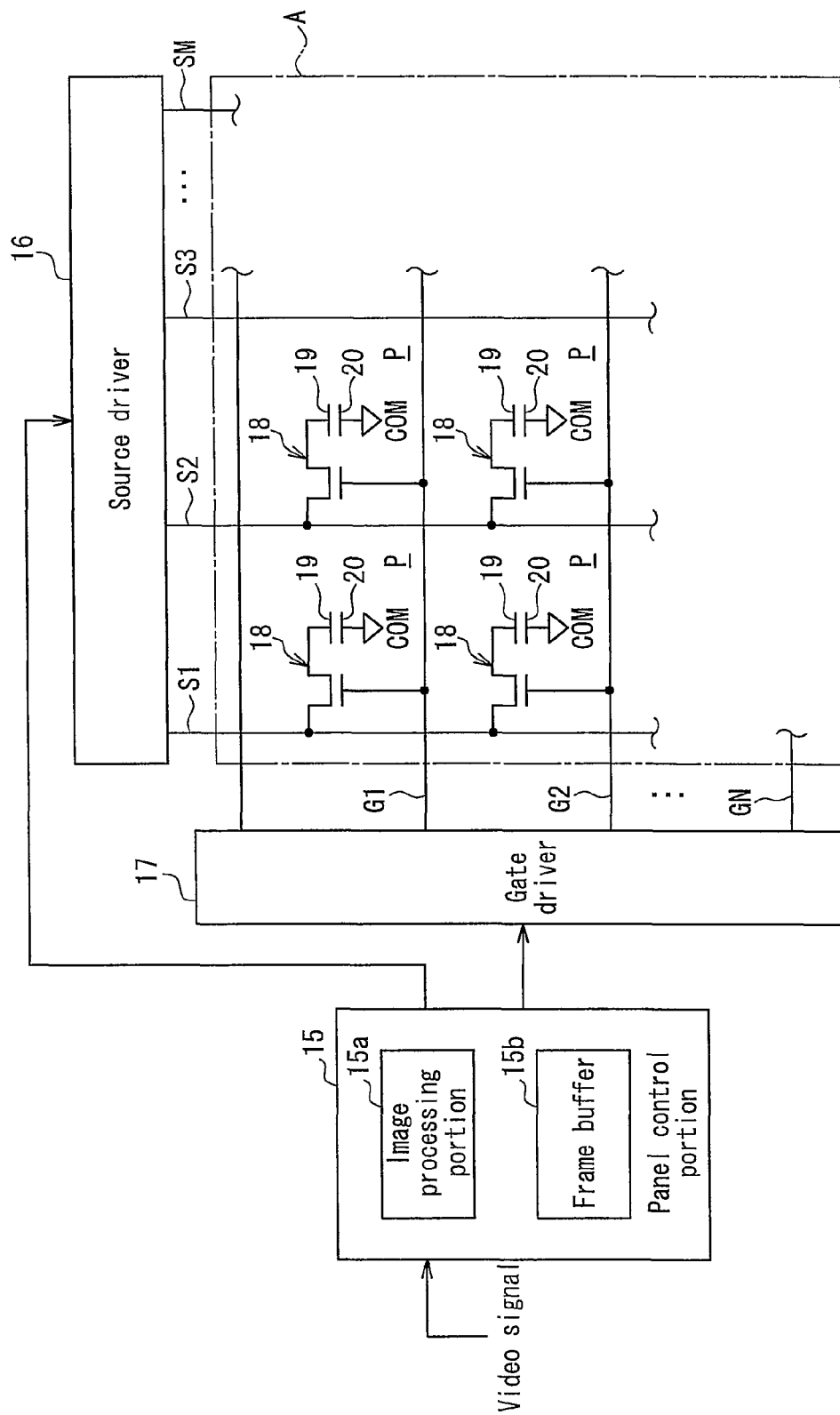
FIG. 2 is a diagram illustrating a configuration of a liquid crystal panel shown in FIG. 1.

FIG. 2 is a diagram illustrating a configuration of the liquid crystal panel shown in FIG. 1.

In FIG. 2, the liquid crystal display device 1 (FIG. 1) is provided with a panel control portion 15 that performs drive control of the liquid crystal panel 2 (FIG. 1) as the display portion that displays information such as characters and images, and a source driver 16 and a gate driver 17 that are operated based on instruction signals from the panel control portion 15.

The panel control portion 15 is placed in the control device and receives video signals from outside of the liquid crystal display device 1. Further, the panel control portion 15 includes an image processing portion 15a that performs predetermined image processing on input video signals so as to generate respective instruction signals to the source driver 16 and the gate driver 17, and a frame buffer 15b that can store one frame of display data contained in the input video signals. The panel control portion 15 performs drive control of the source driver 16 and the gate driver 17 in accordance with input video signals, whereby information in accordance with the video signals is displayed on the liquid crystal panel 2.

The source driver 16 and the gate driver 17 are disposed on the active matrix substrate 5. Specifically, on a surface of the active matrix substrate 5, the source driver 16 is disposed along the horizontal direction of the liquid crystal panel 2 in an outside region of an effective display area A of the liquid crystal panel 2 as a display panel. Further, the gate driver 17 is disposed along the vertical direction of the liquid crystal panel 2 in the outside region of the effective display area A on the surface of the active matrix substrate 5.

Further, the source driver 16 and the gate driver 17 are drive circuits that drive, on a pixel basis, a plurality of pixels P placed on the liquid crystal panel 2 side. The source driver 16 and the gate driver 17 respectively are connected to a plurality of source lines S1-SM (M is an integer of 2 or more; hereinafter, referred to as "S" collectively) and a plurality of gate lines G1-GN (N is an integer of 2 or more; hereinafter, referred to as "G" collectively). The source lines S and the gate lines G respectively constitute data lines and scanning lines that are arranged in a matrix so as to cross each other on a base material (not shown) made of a transparent glass material or a transparent synthetic resin contained in the active matrix substrate 5. In other words, the source lines S are formed on the base material so as to be parallel to a column direction in the matrix (the vertical direction of the liquid crystal panel 2) and the gate lines G are formed on the base material so as to be parallel to a row direction in the matrix (the horizontal direction of the liquid crystal panel 2).

Further, in the vicinity of each intersection between the source lines S and the gate lines G, a thin film transistor 18 as a switching element and a pixel P that has a pixel electrode 19 connected to the thin film transistor 18 are provided. Further, in each of the pixels P, a common electrode 20 is opposed to the pixel electrode 19, with the liquid crystal layer of the liquid crystal panel 2 being interposed therebetween. In other words, in the active matrix substrate 5, the thin film transistor 18, the pixel electrode 19 and the common electrode 20 are provided per pixel.

Further, in the active matrix substrate 5, in the respective regions partitioned in a matrix by the source lines S and the gate lines G, a plurality of regions of the pixels P are formed. The plurality of pixels P include red (R), green (G) and blue (B) pixels. The RGB pixels are arranged sequentially in parallel to the gate lines G1-GN in this order, for example. Further, the RGB pixels can display corresponding color by color filter layers (not shown) provided on the color filter substrate 4 side.

Further, in the active matrix substrate 5, the gate driver 17 sequentially outputs scanning signals (gate signals) with respect to the gate lines G1-GN so as to bring gate electrodes of the corresponding thin film transistors 18 to an ON state based on instruction signals from the image processing portion 15a. Further, the source driver 16 outputs data signals (voltage signals (gradation voltage)) in accordance with brightness (gradation) of the display image with respect to the corresponding source lines S1-SM, based on instruction signals from the image processing portion 15a.

Next, a configuration of main portions of the active matrix substrate 5 of the present embodiment will be described specifically also with reference to FIGS. 3 and 4.

Figure 3:
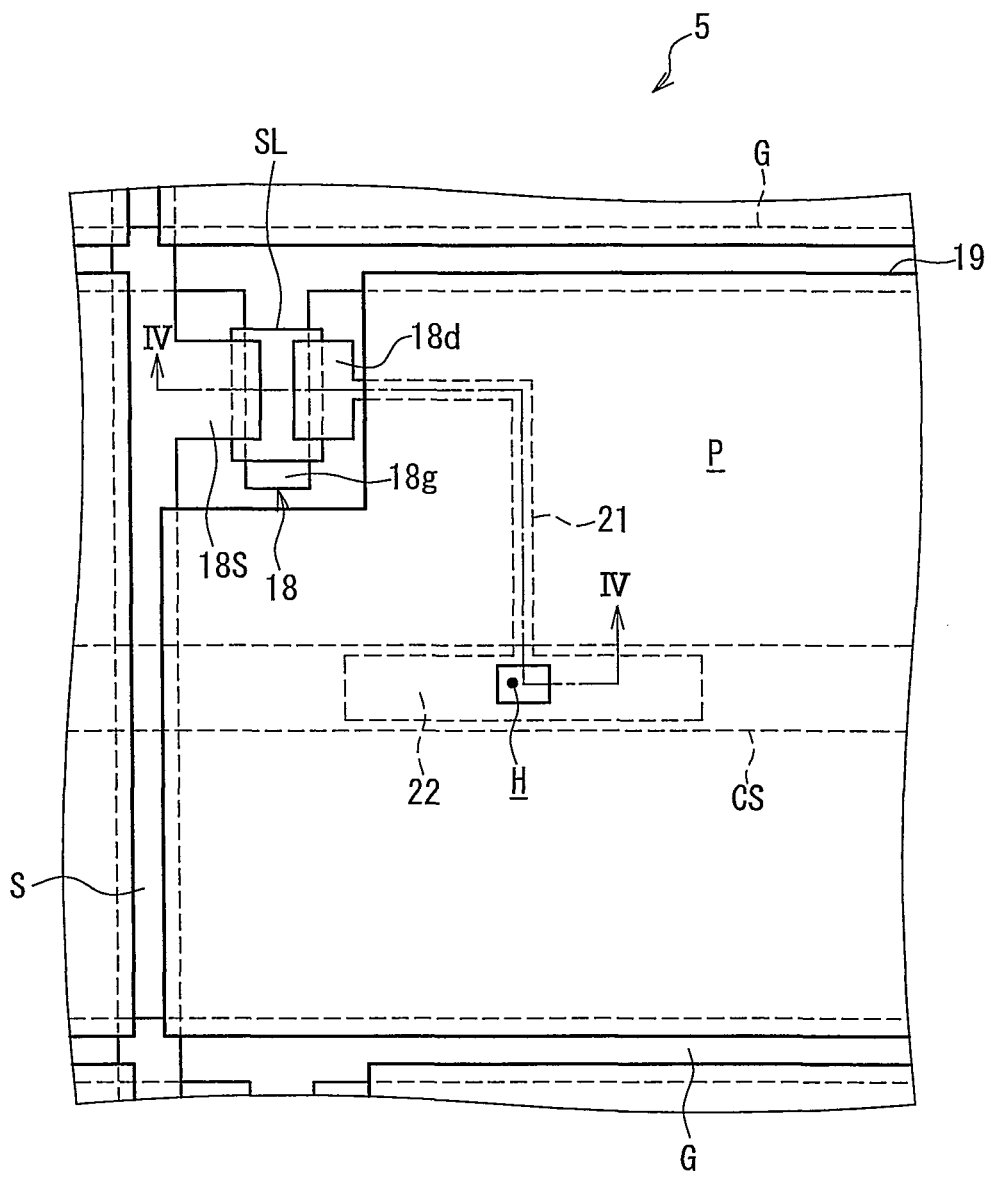
FIG. 3 is a view illustrating a configuration of main portions of an active matrix substrate shown in FIG. 1.

FIG. 3 is a view illustrating a configuration of main portions of the active matrix substrate shown in FIG. 1. FIG. 4 is a cross-sectional view taken along a line IV-IV in FIG. 3.

As shown in FIG. 3, in the active matrix substrate 5, the thin film transistor 18 and the pixel electrode 19 are disposed per pixel P. The thin film transistor 18 includes a source electrode 18s provided integrally with the source line S, a drain electrode 18d provided to be opposed to the source electrode 18s, and a semiconductor layer SL and a gate electrode 18g provided sequentially under the source electrode 18s and the drain electrode 18d. The gate electrode 18g is provided integrally with the gate line G. Further, the drain electrode 18d is formed of one end portion of a three-layered metal film 21, which is provided as a metal film described later.

Further, in the active matrix substrate 5, auxiliary capacitance lines CS are disposed parallel to the gate lines G so as to pass substantially the center of the pixels P between two adjacent gate lines G. An auxiliary capacitance electrode 22 is disposed above the auxiliary capacitance line CS. Further, the auxiliary capacitance electrode 22 is formed of the other end portion of the three-layered metal film 21. A contact hole portion H connecting the pixel electrode 19 and the three-layered metal film (metal film) 21 is formed above the auxiliary capacitance electrode 22. In the contact hole portion H, as described later, the pixel electrode 19 and the three-layered metal film 21 are connected to each other via an anodic oxidation film. Note that a dimension of the contact hole portion H in the vertical direction (direction parallel to the source lines S) and a dimension thereof in the horizontal direction (direction parallel to the gate lines G) are set at 30 µm, for example.

Figure 4:
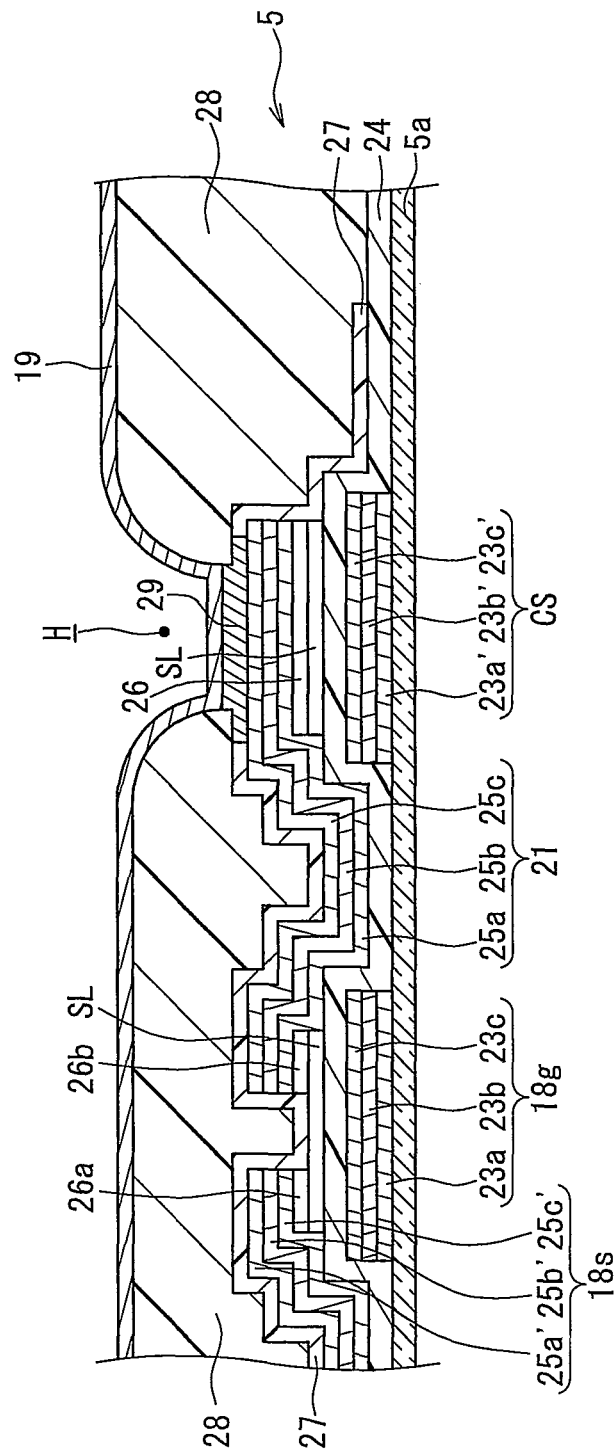
FIG. 4 is a cross-sectional view taken along a line IV-IV in FIG. 3.

Further, in the active matrix substrate 5, as shown in FIG. 4, a base material 5a made of a non-alkali glass, for example, is used. On the base material 5a, the thin film transistor 18 (FIG. 3), the auxiliary capacitance line CS, the auxiliary capacitance electrode 22 (FIG. 3) and the contact hole portion H are formed.

Specifically, the gate electrode 18g composed of a three-layered metal film having a titanium layer 23a, an aluminum layer 23b and a titanium layer 23c is disposed on the base material 5a. Further, a gate insulating film 24 is disposed over the gate electrode 18g, and the semiconductor layer SL is disposed on the gate insulating film 24. Contact layers 26a and 26b, which are connected to a source region and a drain region of the semiconductor layer SL, respectively, are disposed on the semiconductor layer SL.

Other than the above description, in place of the three-layered metal film having the titanium layer 23a, the aluminum layer 23b and the titanium layer 23c, the gate electrode 18g may be formed using a single metal film to which pure metal or impurity is added, or other multi-layered metal film.

Further, the drain electrode 18d (FIG. 3) of the thin film transistor 18 is disposed above the contact layer 26b. As described above, one end portion of the three-layered metal film 21 as the metal film connecting the drain electrode 18d and the pixel electrode 19 is used as the drain electrode 18d. Further, a three-layered metal film having a titanium layer 25a, an aluminum layer 25b and a titanium layer 25c, for example, is used as the three-layered metal film 21.

The source electrode 18s of the thin film transistor 18 is disposed above the contact layer 26a. The same metal film as the three-layered metal film 21 is used for the source electrode 18s. In other words, the source electrode 18s is formed of one end portion of a three-layered metal film having a titanium layer 25a', an aluminum layer 25b' and a titanium layer 25c', for example. Further, the other end portion of the metal film is formed integrally with the source line S (FIG. 3). A protective layer 27 is disposed over the three-layered metal film 21 and the three-layered metal film having the titanium layer 25a', the aluminum layer 25b' and the titanium layer 25c'. Further, the protective layer 27 is formed also on a channel region of the semiconductor layer SL between the contact layers 26a and 26b. Moreover, an insulating layer 28 as an (interlayer) insulating film is disposed on the protective layer 27.

Meanwhile, on the contact hole portion H side, the auxiliary capacitance line CS composed of the same three-layered metal film as that of the gate electrode 18g, for example, is disposed on the base material 5a. In other words, the auxiliary capacitance line CS is formed of a three-layered metal film having a titanium layer 23a', an aluminum layer 23b' and a titanium layer 23c', for example. Further, the gate insulating film 24 is disposed over the auxiliary capacitance line CS, and the semiconductor layer SL and the contact layer 26 are disposed sequentially on the gate insulating film 24.

Other than the above description, in place of the three-layered metal film having the titanium layer 23a', the aluminum layer 23b' and the titanium layer 23c', the auxiliary capacitance line CS may be formed using a single metal film to which pure metal or impurity is added, or other multi-layered metal film.

Further, the auxiliary capacitance electrode 22 (FIG. 3) formed of the other end portion of the three-layered metal film 21 is disposed above the contact layer 26. The auxiliary capacitance electrode 22 and the auxiliary capacitance line CS are connected to each other by capacitive coupling via the gate insulating film 24, the semiconductor layer SL, and the contact layer 26. Further, in the other end portion of the three-layered metal film 21 (auxiliary capacitance electrode 22), an anodic oxidation film 29 (i.e., titanium oxide) formed by anodically oxidizing the upper titanium layer 25c is formed on the three-layered metal film 21. Further, as shown in FIG. 4, the anodic oxidation film 29 is formed so as to fill a contact hole of the protective layer 27, with an end portion of the anodic oxidation film 29 being placed under the insulating layer 28. Further, in the contact hole portion H, the anodic oxidation film 29 is connected to the pixel electrode 19.

Other than the above description, without providing the semiconductor layer SL and the contact layer 26, the auxiliary capacitance electrode 22 and the auxiliary capacitance line CS may be connected to each other by capacitive coupling via the gate insulating film 24.

Next, a method for producing main portions of the active matrix substrate 5 of the present embodiment configured as above will be described specifically with reference to FIGS. 5 and 6.

Figure 5A:
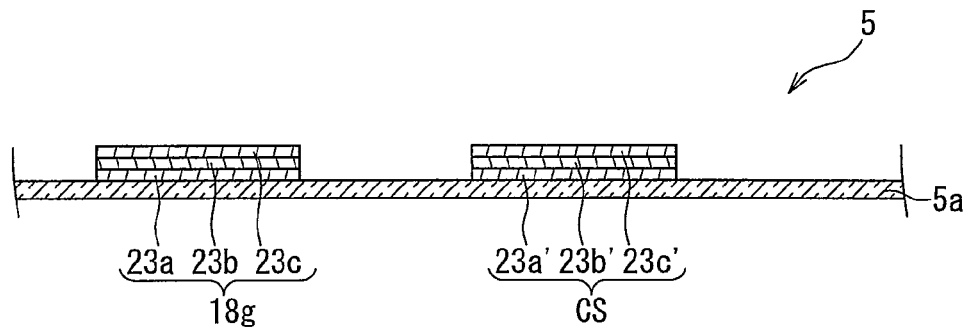
FIGS. 5A to 5C illustrate a series of the main production processes.
Figure 5B:
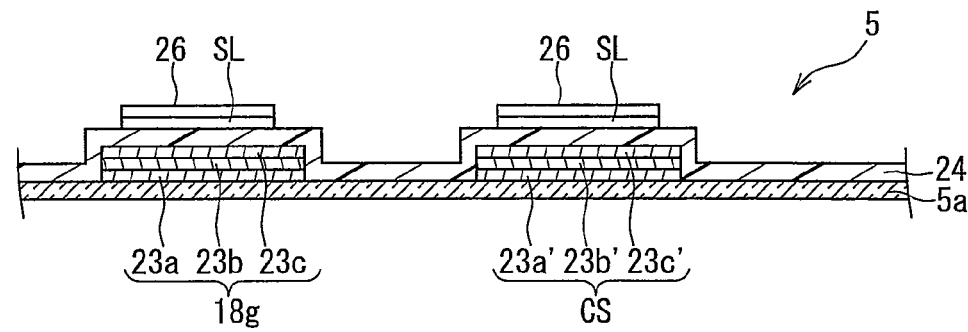
Figure 5C:
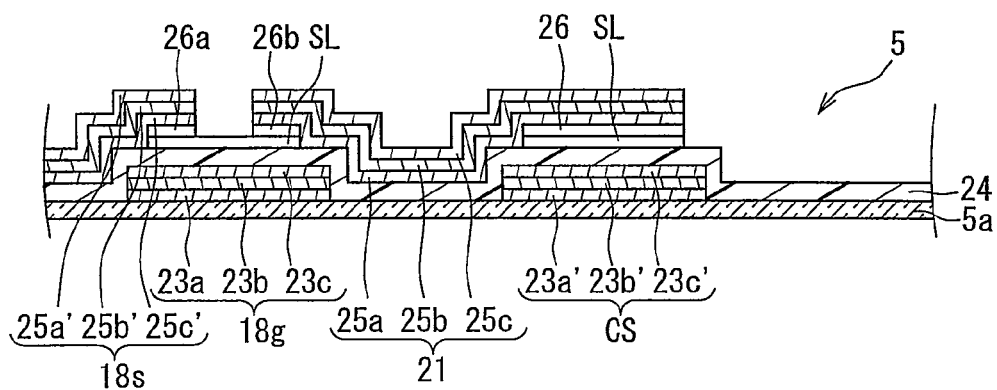
Figure 6A:
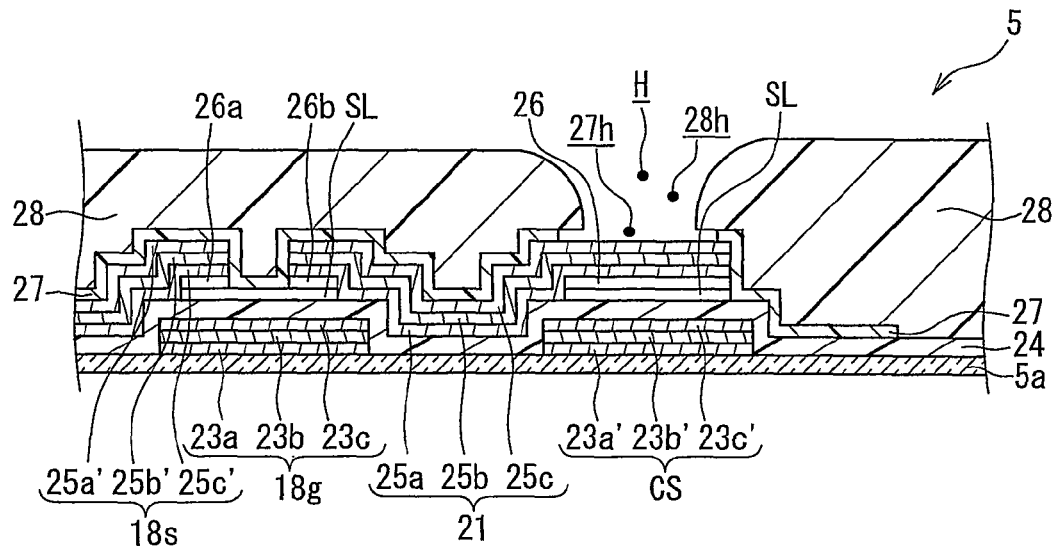
FIGS. 6A and 6B illustrate a series of the main production processes to be performed after the processes shown in FIG. 5C.
Figure 6B:
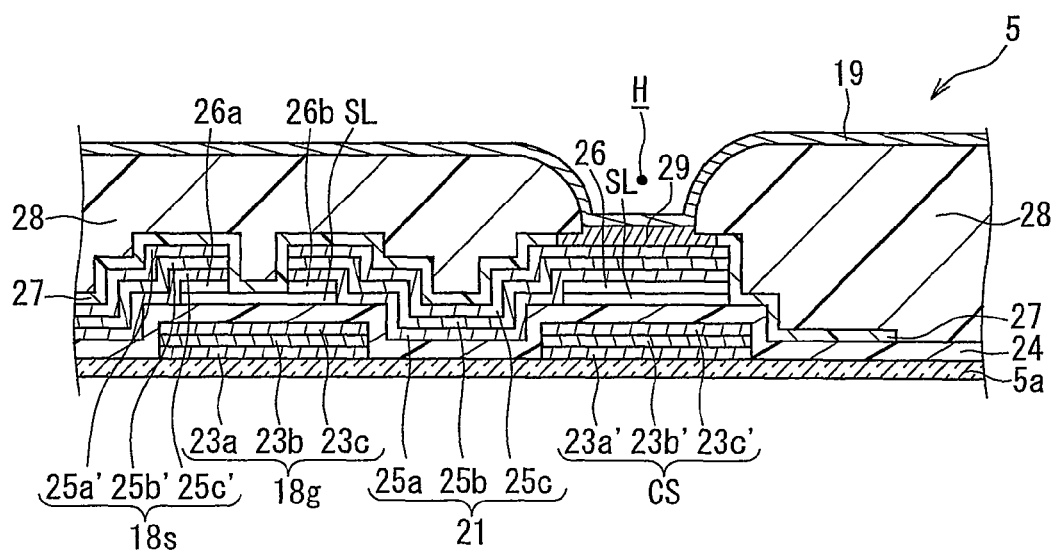

FIG. 5 includes views illustrating production processes of the active matrix substrate, and FIGS. 5A to 5C illustrate a series of the main production processes. FIG. 6 includes views illustrating production processes of the active matrix substrate, and FIGS. 6A and 6B illustrate a series of the main production processes to be performed after the processes shown in FIG. 5C.

As shown in FIG. 5A, in the active matrix substrate 5, first, a three-layered metal film having a titanium layer 23a, an aluminum layer 23b and a titanium layer 23c, and a three-layered metal film having a titanium layer 23a', an aluminum layer 23b' and a titanium layer 23c' are formed on a base material 5a by a sputtering method, for example. Specific thicknesses of the titanium layers 23a, 23a', the aluminum layers 23b, 23b' and the titanium layers 23c, 23c' respectively are 30 nm, 250 nm and 150 nm, for example. Next, by patterning these three-layered metal films by a photolithography method, for example, a gate electrode 18g and an auxiliary capacitance line CS are formed on the base material 5a. Further, at this time, gate lines G are formed on the base material 5a simultaneously.

Next, as shown in FIG. 5B, by a plasma CVD method, for example, a gate insulating film 24 made of a silicon nitride (SiNx) film, for example, is formed so as to cover the gate electrode 18g and the auxiliary capacitance line CS on the base material 5a. A specific thickness of the gate insulating film 24 is 400 nm, for example. Then, a semiconductor layer SL made of an amorphous silicon (a-Si) film and an n+ amorphous silicon layer 26 doped with phosphorus (P), for example, are laminated above the gate electrode 18g and the auxiliary capacitance line CS, and patterned so as to have a cross section shown in FIG. 5B. Specific thicknesses of the semiconductor layer SL and the n+ amorphous silicon layer 26 respectively are 200 nm and 50 nm, for example.

Next, as shown in FIG. 5C, by a sputtering method, for example, a three-layered metal film 21 having a titanium layer 25a, an aluminum layer 25b and a titanium layer 25c is formed. Then, by patterning the three-layered metal film 21, a source electrode 18s and a drain electrode 18d are formed. In other words, one end portion of the three-layered metal film 21 is configured as the drain electrode 18d, and an end portion of a three-layered metal film having a titanium layer 25a', an aluminum layer 25b' and a titanium layer 25c' and being separated from the drain electrode 18d by a predetermined distance is configured as the source electrode 18s. Further, the other end portion of the three-layered metal film 21 is configured as an auxiliary capacitance electrode 22. In this manner, a metal film forming process is completed in which a metal film connecting the drain electrode 18d of the thin film transistor 18 and the pixel electrode 19 is formed on the base material 5a. Specific thicknesses of the titanium layers 25a, 25a', the aluminum layers 25b, 25b' and the titanium layers 25c, 25c' respectively are 40 nm, 250 nm and 200 nm, for example.

After that, by removing the n+ amorphous silicon layer 26 by etching using the source electrode 18s and the drain electrode 18d as a mask, a channel region is formed in the semiconductor layer SL. In other words, as shown in FIG. 5C, the source electrode 18s that is formed of the end portion of the three-layered metal film having the titanium layer 25a', the aluminum layer 25b' and the titanium layer 25c' is connected to a source region of the semiconductor layer SL via the contact layer 26a. Further, the drain electrode 18d that is formed of one end portion of the three-layered metal film 21 having the titanium layer 25a, the aluminum layer 25b and the titanium layer 25c is connected to a drain region of the semiconductor layer SL via the contact layer 26b. Further, in a region above the channel region of the semiconductor layer SL, the n+ amorphous silicon layer 26 and the three-layered metal film 21 are removed.

Next, as shown in FIG. 6A, by a CVD method, for example, a silicon nitride (SiNx) layer, for example, is formed over the source electrode 18s and the drain electrode 18d so as to cover the three-layered metal film 21, whereby a protective layer 27 is formed. In this manner, a protective layer forming process is completed in which the protective layer 27 is formed so as to cover the three-layered metal film (metal film) 21. Further, a specific thickness of the protective layer 27 is 80 nm, for example.

Next, as shown in FIG. 6A, by a photolithography method, for example, an (interlayer) insulating layer 28 made of a transparent resin is formed on the protective layer 27. A specific thickness of the insulating layer 28 is 3000 nm, for example. Further, a contact hole 28h of the contact hole portion H is formed in the insulating layer 28. In this manner, an insulating layer forming process is completed in which the insulating layer 28 is formed on the protective layer 27 so as to be provided with the contact hole 28h of the contact hole portion H connecting the pixel electrode 19 and the three-layered metal film (metal layer) 21.

Further, as shown in FIG. 6A, in the contact hole portion H, by removing the protective layer 27 by etching using the insulating layer 28 as a mask, a contact hole 27h of the contact hole portion H is formed in the protective layer 27. In this manner, a contact hole forming process is completed in which the contact hole 27h of the contact hole portion H is formed in the protective layer 27 using the insulating layer 28 as a mask. After the completion of this process, in the contact hole portion H, the titanium layer 25c on the upper side of the three-layered metal film 21 is exposed.

Next, as shown in FIG. 6B, an anodic oxidation film 29 is formed in the contact hole portion H. Specifically, by anodically oxidizing the upper titanium layer 25c at a formation voltage of 80 V using a 1% phosphoric acid aqueous solution, for example, the anodic oxidation film 29 made of titanium oxide is formed. In this manner, an anodic oxidation film forming process is completed in which the anodic oxidation film 29 is formed on the three-layered metal film (metal film) 21 so as to fill the contact hole 27h of the protective layer 27 with an end portion of the anodic oxidation film 29 being placed under the insulating layer 28, by anodically oxidizing the three-layered metal film (metal film) 21 that is exposed in the contact hole 27h formed in the protective layer 27. In other words, by anodically oxidizing the titanium layer 25c, a volume of the titanium layer 25c expands, whereby the anodic oxidation film 29 (titanium oxide layer) 29 is formed. Therefore, as shown in FIG. 6B, no step difference is formed between the insulating layer 28 and the anodic oxidation film 29, which avoids disconnection of the pixel electrode 19 in the contact hole portion H.

Then, as shown in FIG. 6B, by depositing a transparent conducting film such as ITO on the insulating layer 28 using a sputtering method, for example, and patterning the conducting film, the pixel electrode 19 is formed above the thin film transistor 18 and the auxiliary capacitance electrode 22. In this manner, a connecting process is completed in which the pixel electrode 19 and the three-layered metal film (metal film) 21 are connected to each other via the anodic oxidation film 29 in the contact hole portion H. Further, a specific thickness of the pixel electrode 19 is 130 nm.

In the active matrix substrate 5 of the present embodiment configured as above, the anodic oxidation film 29 is formed on the three-layered metal film (metal film) 21 so as to fill the contact hole 27h of the protective layer 27, with an end portion of the anodic oxidation film 29 being placed under the insulating layer 28. Further, in the contact hole portion H, the pixel electrode 19 and the three-layered metal film 21 are connected to each other via the anodic oxidation film 29. Thereby, in the active matrix substrate 5 of the present embodiment, unlike the conventional example, step coverage can be performed with respect to undercut in the protective layer 27 without removing the insulating layer in the periphery of the contact hole of the protective layer to expose a borderline of the protective layer in the contact hole. Consequently, in the present embodiment, unlike the conventional example, the production process of the active matrix substrate 5 can be simplified.

Further, in the present embodiment, by anodically oxidizing the titanium layer 25c on the upper side of the three-layered metal film 21, the volume of the titanium layer 25c is expanded so that the anodic oxidation film 29 is formed to eliminate the step difference between the insulating layer 28 and the anodic oxidation film 29. Thus, the occurrence of disconnection of the pixel electrode 19 in the contact hole portion H, etc., can be avoided, which makes it possible to easily configure the active matrix substrate 5 with excellent reliability.

Further, since the active matrix substrate 5 whose production process can be simplified is used in the present embodiment, a liquid crystal display device (display device) 1 produced simply can be configured easily.

The above embodiments are shown for illustrative purposes and are not limiting. The technical range of the present invention is defined by the claims, and all the modifications within the range equivalent to the configuration recited in the claims are also included in the technical range of the present invention.

For example, in the above description, the present invention is applied to a transmission type liquid crystal display device. However, the display device of the present invention is not particularly limited as long as an active matrix substrate is used as the display device. Specifically, the display device of the present invention can be applied to various display devices using an active matrix substrate, such as a semi-transmission type or reflection type liquid crystal panel, an organic electronic luminescence (EL) element, an inorganic EL element, and a field emission display.

Further, in the above description, a three-layered metal film having a titanium layer, an aluminum layer and a titanium layer is used as the metal film, and a titanium oxide (anodic oxidation film) formed by anodically oxidizing the upper titanium layer is used. However, the active matrix substrate of the present invention is not particularly limited as long as an anodic oxidation film is formed on the metal film in the contact hole portion by anodically oxidizing the metal film so as to fill the contact hole of the protective layer with an end portion of the anodic oxidation film being placed under the insulating layer, and the pixel electrode and the metal film are connected to each other via the anodic oxidation film in the contact hole portion.

Specifically, a three-layered metal film having a niobium layer, an aluminum layer and a titanium layer may be used as the metal film, and a niobium oxide (anodic oxidation film) formed by anodically oxidizing the upper niobium layer may be used. Further, a three-layered metal film having a titanium layer or a niobium layer and an aluminum layer may be used as the metal film, and a titanium oxide or a niobium oxide may be used as an anodic oxide. Further, titanium or niobium may be used as the metal film, and a titanium oxide or a niobium oxide may be used as the anodic oxide. Moreover, for example, titanium or niobium to which predetermined impurity is added may be used as the metal film, and an anodic oxide of the metal may be used. Note that the case where an anodic oxidation film of titanium or niobium is used is preferred, because the metal film and the pixel electrode can be electrically connected to each other reliably.

Further, in the above description, one end portion and the other end portion of the three-layered metal film (metal film) are used as the drain electrode and the auxiliary capacitance electrode, respectively. However, the present invention is not limited thereto, and one end portion and the other end portion of the metal film, the drain electrode and the auxiliary capacitance electrode can be configured separately. In other words, the present invention can be applied to an active matrix substrate not provided with the auxiliary capacitance electrode.

Note that the case where an end portion of the metal film is used as the drain electrode or auxiliary capacitance electrode is preferred because an active matrix substrate produced more simply can be configured, which makes it possible to simplify the production process easily. Moreover, as in the above embodiment, the case where one end portion and the other end portion of the metal film are used as the drain electrode and the auxiliary capacitance electrode, respectively, is preferred because an active matrix substrate produced further simply can be configured in the active matrix substrate having the auxiliary capacitance electrode, which makes it possible to simplify the production process more easily.

INDUSTRIAL APPLICABILITY

The present invention is useful with respect to an active matrix substrate whose production process can be simplified, a production method thereof, and a display device using the active matrix substrate.

DESCRIPTION OF REFERENCE NUMERALS

1 liquid crystal display device (display device)
5 active matrix substrate
5a base material
18 thin film transistor
18d drain electrode
19 pixel electrode
21 three-layered metal film (metal film)
25a titanium layer
25b aluminum layer
25c titanium layer
22 auxiliary capacitance electrode
27 protective layer
28 insulating layer

The invention claimed is:

1. An active matrix substrate on which pixels, each having a thin film transistor and a pixel electrode connected to the thin film transistor, are disposed in a matrix, and that includes a base material on which the pixels in a matrix are formed,
wherein, on the base material, a metal film connecting a drain electrode of the thin film transistor and the pixel electrode, a protective layer formed so as to cover the metal film, and an insulating layer formed on the protective layer are disposed, in each of the protective layer and the insulating layer, a contact hole of a contact hole portion connecting the pixel electrode and the metal film is provided, in the contact hole portion, an anodic oxidation film is formed on the metal film by anodically oxidizing the metal film so as to fill the contact hole of the protective layer with an end portion of the anodic oxidation film being placed under the insulating layer, and in the contact hole portion, the pixel electrode and the metal film are connected to each other via the anodic oxidation film.

2. The active matrix substrate according to claim 1, wherein an end portion of the metal film is used as the drain electrode.

3. The active matrix substrate according to claim 1, wherein, on the base material, an auxiliary capacitance electrode for generating auxiliary capacitance is provided on the pixel basis, and an end portion of the metal film is used as the auxiliary capacitance electrode.

4. The active matrix substrate according to claim 1, wherein the metal film contains titanium or niobium, and the anodic oxidation film comprises an anodic oxidation film of titanium or niobium.

5. A display device using the active matrix substrate according to claim 1.

* * * * *